(12) United States Patent
Kim et al.

(10) Patent No.: US 9,136,137 B2
(45) Date of Patent: Sep. 15, 2015

(54) ETCHANT COMPOSITION AND METHODS OF FABRICATING METAL WIRING AND THIN FILM TRANSISTOR SUBSTRATE USING THE SAME

(71) Applicant: SAMSUNG DISPLAY CO., LTD., Yongin, Gyeonggi-Do (KR)

(72) Inventors: In-Bae Kim, Yongin-si (KR); Jong-Hyun Choung, Hwaseong-si (KR); Youngmin Moon, Seongnam-si (KR); Hongsick Park, Suwon-si (KR); Gyu-po Kim, Hwaseong-si (KR); Won-guk Seo, Suwon-si (KR); Hyun-cheol Shin, Hwaseong-si (KR); Ki-beom Lee, Seoul (KR); Sam-young Cho, Anyang-si (KR); Seung-yeon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/263,956

(22) Filed: Apr. 28, 2014

(65) Prior Publication Data
US 2015/0087148 A1    Mar. 26, 2015

(30) Foreign Application Priority Data
Sep. 24, 2013    (KR) .......................... 10-2013-0113420

(51) Int. Cl.
*H01L 21/44*    (2006.01)
*H01L 21/306*    (2006.01)
*C23F 1/18*    (2006.01)

(52) U.S. Cl.
CPC ............ *H01L 21/30604* (2013.01); *C23F 1/18* (2013.01)

(58) Field of Classification Search
None
See application file for complete search history.

(56) References Cited

U.S. PATENT DOCUMENTS

| 2010/0018550 | A1 | 1/2010 | Schwartzkopf et al. |
| 2010/0252530 | A1 | 10/2010 | Durante et al. |
| 2012/0252148 | A1* | 10/2012 | Park et al. ....................... 438/34 |

FOREIGN PATENT DOCUMENTS

| KR | 10-2010-0123131 A | 11/2010 |
| KR | 10-2011-0085254 A | 7/2011 |
| KR | 10-2011-0105148 A | 9/2011 |
| KR | 10-2011-0123025 A | 11/2011 |
| KR | 10-2012-0111636 A | 10/2012 |
| KR | 10-2013-0015943 A | 2/2013 |
| KR | 10-2013-0028400 A | 3/2013 |

* cited by examiner

*Primary Examiner* — Kyoung Lee
(74) *Attorney, Agent, or Firm* — Christie, Parker & Hale, LLP

(57) ABSTRACT

An etchant composition including 0.5 wt % to 20 wt % of a persulfate, 0.01 wt % to 1 wt % of a fluorine compound, 1 wt % to 10 wt % of an inorganic acid, 0.01 wt % to 2 wt % of an azole-based compound, 0.1 wt % to 5 wt % of a chlorine compound, 0.05 wt % to 3 wt % of a copper salt, 0.01 wt % to 5 wt % of an antioxidant or a salt thereof, based on a total weight of the etchant composition, and water in an amount sufficient for the total weight of the etchant composition to be equal to 100 wt % is disclosed. The etchant composition is suitable for use in forming a metal wiring by etching a metal layer including copper or in fabricating a thin film transistor substrate for a display apparatus.

17 Claims, 18 Drawing Sheets

ETCHANT COMPOSITION AND METHODS OF FABRICATING METAL WIRING AND THIN FILM TRANSISTOR SUBSTRATE USING THE SAME

CROSS-REFERENCE TO RELATED APPLICATION

This application claims priority to and the benefit of Korean Patent Application No. 10-2013-0113420, filed on Sep. 24, 2013 in the Korean Intellectual Property Office, the entire content of which is hereby incorporated by reference in its entirety.

BACKGROUND

1. Field

Aspects of embodiments of the present disclosure herein relate to an etchant composition and methods of fabricating a metal wiring and a thin film transistor substrate using the same.

2. Description of the Related Art

Recently, display apparatuses, such as a liquid crystal display (LCD) apparatus, a plasma display apparatus, an electrophoretic display apparatus, and an organic light-emitting diode (OLED) display apparatus, have been widely used.

Such display apparatuses may include a substrate and a plurality of pixels included on the substrate. Each pixel may include a gate line on the substrate and a thin film transistor (TFT) coupled to a data line. A gate-on voltage is input to the thin film transistor through the gate line and an image signal is input through the data line.

The gate line and the data line may be formed of metal and may be patterned by a photolithography process.

SUMMARY

Aspects of embodiments of the present disclosure are directed toward an etchant composition having a high etch rate with respect to metal and having improved aging properties.

Aspects of embodiments of the present disclosure are also directed toward a method of forming a metal wiring having reduced wiring failure, such as disconnection.

Aspects of embodiments of the present disclosure are also directed toward a method of fabricating a thin film transistor substrate in which fabrication time and costs are reduced and wiring failure, such as disconnection, is reduced.

Embodiments of the present disclosure provide etchant compositions including: 0.5 wt % to 20 wt % of a persulfate, 0.01 wt % to 1 wt % of a fluorine compound, 1 wt % to 10 wt % of an inorganic acid, 0.01 wt % to 2 wt % of an azole-based compound, 0.1 wt % to 5 wt % of a chlorine compound, 0.05 wt % to 3 wt % of a copper salt, 0.01 wt % to 5 wt % of an antioxidant or a salt thereof, based on a total weight of the etchant composition, and water in an amount sufficient for the total weight of the etchant composition to be equal to 100 wt %.

In some embodiments, the antioxidant or the salt thereof may include ascorbic acid, glutathione, lipoic acid, uric acid, or a salt thereof.

In other embodiments, the persulfate may be selected from the group consisting of potassium persulfate ($K_2S_2O_8$), sodium persulfate ($Na_2S_2O_8$), ammonium persulfate (($NH_4$)$_2S_2O_8$), and mixtures thereof.

In still other embodiments, the fluorine compound may be selected from the group consisting of hydrofluoric acid (HF), sodium fluoride (NaF), sodium bifluoride ($NaHF_2$), ammonium fluoride ($NH_4F$), ammonium bifluoride ($NH_4HF_2$), ammonium fluoroborate ($NH_4BF_4$), potassium fluoride (KF), potassium bifluoride ($KHF_2$), aluminum fluoride ($AlF_3$), hydrofluoroboric acid ($HBF_4$), lithium fluoride (LiF), potassium fluoroborate ($KBF_4$), calcium fluoride ($CaF_2$), hexafluorosilicic acid ($H_2SiF_6$), and mixtures thereof.

In even other embodiments, the azole-based compound may be selected from the group consisting of benzotriazole, 5-aminotetrazole, aminotetrazole potassium salt, imidazole, pyrazole, and mixtures thereof.

In yet other embodiments, the chlorine compound may be selected from the group consisting of hydrochloric acid (HCl), ammonium chloride ($NH_4Cl$), potassium chloride (KCl), iron chloride ($FeCl_3$), sodium chloride (NaCl), ammonium perchlorate ($NH_4ClO_4$), potassium perchlorate ($KClO_4$), sodium perchlorate ($NaClO_4$), zinc chloride ($ZnCl_2$), and mixtures thereof.

In further embodiments, the copper salt may be selected from the group consisting of copper nitrate ($Cu(NO_3)_2$), copper sulfate ($CuSO_4$), copper ammonium phosphate ($NH_4CuPO_4$), and mixtures thereof.

In still further embodiments, the etchant composition configured to etch a metal layer including copper, wherein the metal layer may include a plurality of layers including a first metal layer including titanium and a second metal layer including copper, the second metal layer being on the first metal layer.

The etchant composition may be used in forming a metal wiring by etching a metal layer including copper. In other embodiments of the present disclosure, methods of forming a metal wiring include: providing a metal layer including copper; forming a photoresist layer pattern on the metal layer, and etching a portion of the metal layer with an etchant composition utilizing the photoresist layer pattern as a mask; and removing the photoresist layer pattern, wherein the metal layer is etched with the etchant composition according to an embodiment of the present disclosure.

The method of forming a metal wiring may be used during fabrication of a thin film transistor substrate for a display apparatus. In still other embodiments of the present disclosure, methods of fabricating a thin film transistor substrate include: forming a gate line and a gate electrode coupled to the gate line on a substrate; forming a data line insulatively crossing the gate line, a source electrode coupled to the data line, and a drain electrode spaced apart from the source electrode; and forming a pixel electrode coupled to the drain electrode, wherein the gate line, the gate electrode, the data line, the source electrode, and the drain electrode may be formed by a method of forming a metal wiring according to an embodiment of the present disclosure.

BRIEF DESCRIPTION OF THE DRAWINGS

The accompanying drawings are included to provide a further understanding of the inventive concept, and are incorporated in and constitute a part of this specification. The drawings illustrate example embodiments of the present disclosure and, together with the description, serve to describe principles of the present disclosure. In the drawings.

DETAILED DESCRIPTION

Figure 1A:
FIGS. 1A through 1E are cross-sectional views sequentially illustrating a method of forming a metal wiring using an etchant composition according to an embodiment of the present disclosure.

While the embodiments disclosed herein are amenable to various modifications and alternative forms, specific embodiments are shown in the drawings and are described in detail below, by way of example. The intention, however, is not to limit the invention to the particular embodiments described. On the contrary, the invention is intended to cover all modifications, equivalents, and alternatives falling within the scope of the invention as defined by the appended claims and their equivalents.

In the drawings, like reference numerals refer to like elements throughout. Sizes of elements in the drawings may be exaggerated for clarity of illustration. Also, although terms like "first" and "second" are used to describe various components, the components are not limited to these terms. Such terms are used only to differentiate one component from another one. For example, a component referred to as a first component in an embodiment may be referred to as a second component in another embodiment. In a similar manner, a second component may be referred to as a first component. The terms in a singular form may include plural forms unless otherwise specified.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, when an element such as a layer, film, region, or substrate is referred to as being "on" another element, it can be directly on the other element or intervening elements may also be present. Alternatively, when an element such as a layer, film, region, or substrate is referred to as being "under" another element, it may be directly under the other element or intervening elements may also be present. The use of "may" when describing embodiments of the present disclosure refers to "one or more embodiments of the present disclosure."

Hereinafter, an etchant composition according to an embodiment of the present disclosure will be described.

The etchant composition according to an embodiment of the present disclosure is utilized for forming a metal wiring by etching a metal layer, for example, a metal layer including copper, which is stacked on a substrate. In an embodiment of the present disclosure, the metal layer may include a copper layer or a copper alloy layer, but the metal layer is not limited thereto. In an embodiment of the present disclosure, the metal layer may be provided as a single layer. However, the metal layer is not limited thereto, and may be provided as multiple layers. When the metal layer is provided as multiple layers, the metal layer may further include a thin film formed of copper and other metal. For example, the metal layer may be formed of a first metal layer including titanium and a second metal layer including copper. Here, the second metal layer may be on the first metal layer.

The etchant composition according to an embodiment of the present disclosure includes a persulfate, a fluorine compound, an inorganic acid, an azole-based compound, a chlorine compound, a copper salt, and/or an antioxidant or a salt thereof, but the etchant composition is not limited thereto.

The persulfate, as a main oxidant, may etch copper or the metal layer including copper. The persulfate may be present (e.g., contained) in the etchant composition in an amount of about 0.5 wt % to about 20 wt %, based on a total weight of the etchant composition. When the amount of the persulfate is less than about 0.5 wt %, an etch rate may decrease, and thus, suitable (or sufficient) etching may not be achieved. When the amount of the persulfate is greater than about 20 wt %, the etch rate may be excessively high, and thus, the degree of etching may not be adequately controlled. As a result, when the amount of the persulfate is greater than about 20 wt %, the metal layer including copper may be over-etched.

The persulfate, for example, may include potassium persulfate ($K_2S_2O_8$), sodium persulfate ($Na_2S_2O_8$), or ammonium persulfate (($NH_4)_2S_2O_8$), or may include a mixture of two or more thereof, but the persulfate is not limited thereto.

The fluorine compound may etch a layer of titanium, among provided metals, in addition to copper and may remove a residue that may be generated by the etching (e.g., generated by the persulfate or the fluorine compound or a previous etching). The fluorine compound (e.g., a compound including fluorine (F)) is a main component for etching the titanium layer when the metal layer includes the titanium layer.

The fluorine compound may be present (e.g., contained) in the etchant composition in an amount of about 0.01 wt % to about 1.0 wt %, based on the total weight of the etchant composition. When the amount of the fluorine compound is less than about 0.01 wt %, the etching of titanium may be difficult (e.g., the etching may be insufficient), and when the amount of the fluorine compound is greater than about 1.0 wt %, the generation of the residue due to the etching of titanium may increase. Also, when the amount of the fluorine compound is greater than about 1.0 wt %, a glass substrate, on which the titanium is stacked, as well as the titanium may be etched.

The fluorine compound, for example, may include hydrofluoric acid (HF), sodium fluoride (NaF), sodium bifluoride ($NaHF_2$), ammonium fluoride ($NH_4F$), ammonium bifluoride ($NH_4HF_2$), ammonium fluoroborate ($NH_4BF_4$), potassium fluoride (KF), potassium bifluoride ($KHF_2$), aluminum fluoride ($AlF_3$), hydrofluoroboric acid ($HBF_4$), lithium fluoride (LiF), potassium fluoroborate ($KBF_4$), calcium fluoride ($CaF_2$), and/or hexafluorosilicic acid ($H_2SiF_6$), but the fluorine compound is not limited thereto. Also, the fluorine compound may include a mixture of two or more thereof.

The inorganic acid is an auxiliary oxidant. An etch rate may be controlled according to an amount of the inorganic acid in (e.g., present in) the etchant composition. The inorganic acid may react with copper ions in the etchant composition, and as a result, the inorganic acid may prevent (or reduce) a decrease in the etch rate by preventing (or reducing) an increase in the copper ions (e.g., an increase in the number of copper ions). The inorganic acid may be present (e.g., contained) in the etchant composition in an amount of about 1 wt % to about 10 wt %, based on the total weight of the etchant composition. When the amount of the inorganic acid is less than about 1 wt %, a sufficient etch rate may not be achieved due to the decrease in the etch rate, and when the amount of the inorganic acid is greater than about 10 wt %, cracks may occur in a photoresist layer that is used during the etching of the metal layer or the photoresist layer may be exfoliated. When cracks occur in the photoresist layer or the photoresist layer is exfoliated, the titanium layer or the copper layer, which is under the photoresist layer, may be over-etched.

The inorganic acid may include nitric acid, sulfuric acid, phosphoric acid, or perchlorate, or may include a mixture of two or more thereof, but the inorganic acid is not limited thereto.

The azole-based compound, as a five-membered ring heterocyclic compound, may include nitrogen atoms. The azole-based compound may control the etching of copper in the metal layer. When the titanium layer is included on and/or under the copper layer in the metal layer, an etch rate between the copper layer and the titanium layer may be controlled by adjusting an amount of the azole-based compound in the etchant composition. The azole-based compound may reduce a cut dimension (CD) loss of the metal wiring. Examples of the azole-based compound include benzotriazole, aminotetrazole, aminotetrazole potassium salt, imidazole, or pyrazole, but the azole-based compound is not limited thereto. Also, the azole-based compound may include a mixture of two or more thereof.

The azole-based compound may be present (e.g., contained) in the etchant composition in an amount of about 0.01 wt % to about 2.0 wt %, based on the total weight of the etchant composition. When the amount of the fluorine compound is less than about 0.01 wt %, the etch rate of the copper layer may be difficult to control, and when a titanium layer is added, the etch rate between the copper layer and the titanium layer may be difficult to control. When the amount of the azole-based compound is greater than about 2.0 wt %, the etching ability of the etchant composition may be decreased by the azole-based compound.

The chlorine compound is used as an auxiliary oxidant that etches a metal layer including copper and may adjust a taper angle of the metal layer according to its amount. Also, the chlorine compound may induce uniform etching of the metal layer by preventing (or reducing) an erosion phenomenon of the metal layer.

The chlorine compound may be present (e.g., contained) in the etchant composition in an amount of about 0.1 wt % to about 5.0 wt %, based on the total weight of the etchant composition. When the amount of the chlorine compound is less than about 0.1 wt %, the etch rate of the metal layer including copper may decrease to produce a poor etch profile, and when the amount of the chlorine compound is greater than about 5.0 wt %, over-etching may occur, and thus, the metal wiring may be damaged or destroyed.

The chlorine compound may be a compound that may be dissociated into chlorine ions, and, for example, hydrochloric acid (HCl), sodium chloride (NaCl), potassium chloride (KCl), iron chloride ($FeCl_3$), and/or ammonium chloride ($NH_4Cl$) may be used as the chlorine compound, but the chlorine compound is not limited thereto.

Examples of the chlorine compound may include hydrochloric acid (HCl), ammonium chloride ($NH_4Cl$), potassium chloride (KCl), iron chloride ($FeCl_3$), sodium chloride (NaCl), ammonium perchlorate ($NH_4ClO_4$), potassium perchlorate ($K_4ClO_4$), sodium perchlorate ($Na_4ClO_4$), and zinc chloride ($ZnCl_2$), but the chlorine compound is not limited thereto. The above chlorine compounds may be used alone or in combination of two or more thereof.

The copper salt may control a cut dimension (CD) skew and may be present (e.g., contained) in the etchant composition in an amount of about 0.05 wt % to about 3.0 wt %, based on the total weight of the etchant composition. When the amount of the copper salt is less than about 0.05 wt %, the deviation of the changes in the CD skew for the number of treated metal layers may be large, and when the amount of the copper salt is greater than about 3.0 wt %, it may become a factor of decreasing the number of the treated metal layers by decreasing oxidizing power of the main oxidant.

Examples of the copper salt include copper nitrate ($Cu(NO_3)_2$), copper sulfate ($CuSO_4$), and copper ammonium phosphate ($NH_4CuPO_4$), and these copper salts may be used alone or in combination of two or more thereof, but the copper salt is not limited thereto.

The antioxidant or the salt thereof may inhibit (or reduce) the generation of insoluble precipitates. The insoluble precipitates may be generated by $CuCl_2$, which is formed by reacting $Cu^{2+}$ ions included during the etching of the copper layer with the chlorine compound acting as a source. The insoluble precipitates may be generated by reacting $Cu^{2+}$ ions formed during the etching of the copper layer with the azole-based compound. That is, the insoluble precipitates may be generated by forming a complex between the copper salt or $Cu^{2+}$ ions formed during the etching of the copper layer and the azole-based compound.

A mechanism by which the insoluble precipitates are generated may be expressed by Reaction Scheme 1 below, where ATZ denotes an azole-based compound and the ATZ is used as a chelate to form a complex with $Cu^{2+}$ ions. Reaction Scheme 1

$$Cu^{2+}(aq)+2NaCl(aq) \rightarrow Cu^{2+}(aq)+2Cl^-(aq)+2Na^+(aq)$$
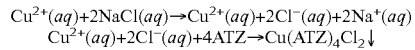

Since the antioxidant or the salt thereof may reduce $Cu^{2+}$ ions to $Cu^+$ ions, the antioxidant or the salt thereof may inhibit (or reduce) the above complex reaction shown in Reaction Scheme 1. The antioxidant or the salt thereof may prevent (or reduce an amount or likelihood of) the occurrence of an additional chelating reaction with other metal ions that may be generated during the etching, and as a result, the antioxidant or the salt thereof may increase the number of metal layers that can be treated using or utilizing the etchant composition. The antioxidant or the salt thereof may include ascorbic acid, glutathione, lipoic acid, uric acid, and/or a salt thereof, but the antioxidant is not limited thereto.

In an embodiment of the present disclosure, the antioxidant or the salt thereof may be ascorbic acid or ascorbate, but the antioxidant and salt thereof are not limited thereto.

The ascorbic acid may reduce $Cu^{2+}$ ions to $Cu^+$ ions by a reaction as shown in Reaction Scheme 2 below.

Reaction Scheme 2

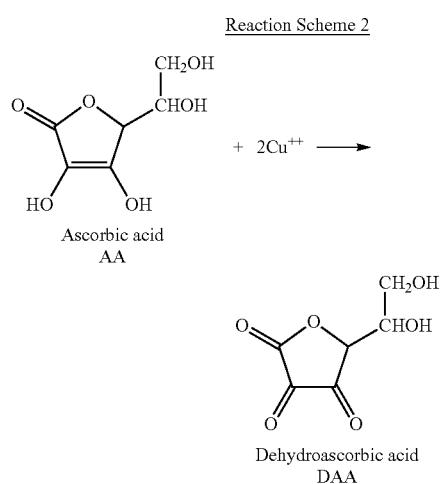

Ascorbic acid
AA

Dehydroascorbic acid
DAA

The antioxidant or the salt thereof may be present (e.g., contained) in the etchant composition in an amount of about 0.01 wt % to about 5.0 wt %, based on the total weight of the etchant composition. When the amount of the antioxidant or the salt thereof is less than about 0.01 wt %, the ability to inhibit (or reduce) the generation of insoluble precipitates may be decreased, and when the amount of the antioxidant or the salt thereof is greater than about 5.0 wt %, the etch rate of copper may be decreased, thereby increasing the etching time in a process, and thus, productivity may be decreased.

The etchant composition may further include an additional etch regulator, a surfactant, and a pH regulator in addition to the above-described components.

A residual amount of water may be present (e.g., contained) in the etchant composition to bring the total weight of the etchant composition to about 100 wt %. The water may be deionized water.

The etchant composition may be used in a process of fabricating electronic devices and, for example, may be used in etching a metal layer stacked on a substrate during a process of fabricating electronic devices.

For example, the etchant composition according to the embodiment of the present disclosure is used in a case where a data wiring is formed by etching a metal layer formed of copper during a process of fabricating a display apparatus. However, the use of the etchant composition is not limited thereto, and the etchant composition may also be used in forming a wiring other than the data wiring, for example, the etchant composition may be used in forming a gate wiring.

The etchant composition almost or effectively does not generate insoluble precipitates. For example, after etching, the etchant composition may be substantially free from insoluble precipitates, and aging of the etchant composition is low (e.g., the etchant composition retains its ability to function as an etchant composition even after being used as an etchant). For example, because the generation of the insoluble precipitates during the etching may be decreased or prevented, the number of times a filter in equipment for filtering the insoluble precipitates should be replaced may not only be decreased, but defects, which are generated by the insoluble precipitates acting as foreign matter, may also be reduced.

FIGS. 1A through 1E are cross-sectional views sequentially illustrating a method of forming a metal wiring, for example, a metal wiring including copper, using or utilizing an etchant composition according to an embodiment of the present disclosure. Hereinafter, an etchant composition for etching a metal layer, which includes a first metal layer including titanium and a second metal layer including copper, will be described as an example.

Referring to FIG. 1A, a metal layer is stacked on an insulating substrate INS. The metal layer may be a double layer in which a first metal layer CL1 formed of a first metal and a second metal layer CL2 formed of a second metal that is different from the first metal are sequentially stacked. In an embodiment, the first metal may be titanium, and the second metal may be copper. In an embodiment, the double layer is disclosed as an example of the metal layer. However, the metal layer is not limited thereto, and the metal layer may be a single layer formed of an alloy that includes the first metal and the second metal, or may be multiple layers, such as a triple layer or more in which the first metal layer CL1 and the second metal layer CL2 are alternatingly stacked.

Figure 1B:
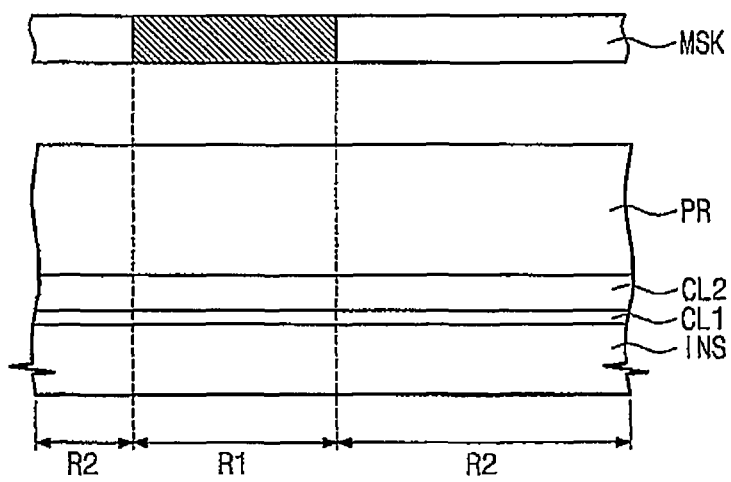

Next, as illustrated in FIG. 1B, a photoresist layer PR is formed on an entire surface of the insulating substrate INS, and the photoresist layer PR is then exposed through a mask MSK.

The mask MSK includes a first region R1 that completely (or substantially completely) blocks incident light, and a second region R2 that transmits a portion of the incident light and blocks the other portion of the incident light. An upper surface of the insulating substrate INS is divided into regions respectively corresponding to the first region R1 and the second region R2. Hereinafter, the corresponding regions of the insulating substrate INS are also referred to as the first region R1 and the second region R2, respectively.

Figure 1C:
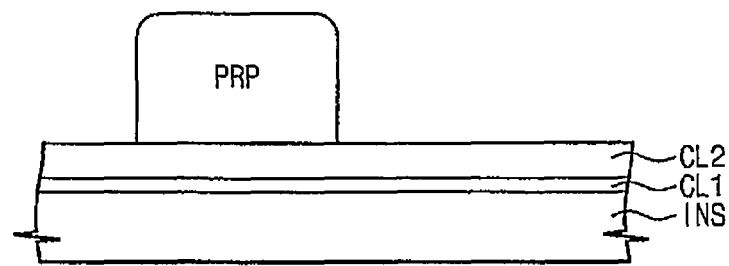

Subsequently, the photoresist layer PR exposed through the mask MSK is developed, and a photoresist layer pattern PRP (or only the photoresist layer pattern PRT) having a predetermined (or set) thickness may then remain in a region in which the light is completely (or substantially completely) blocked by the first region R1, as shown in FIG. 1C. Since the photoresist layer may be completely (or substantially completely) removed in the second region R2 in which the light is completely (or substantially completely) transmitted, the surface of the insulating substrate INS may be exposed.

In an embodiment of the present disclosure, a positive photoresist is used to remove the photoresist layer of the exposed region as described above. However, the present disclosure is not limited thereto. In another embodiment of the present disclosure, a negative photoresist may also be used to remove the photoresist layer of the unexposed region.

Figure 1D:
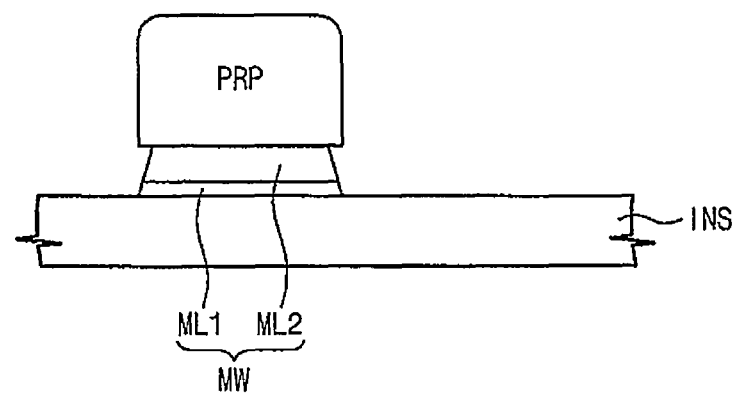

Referring to FIG. 1D, the first metal layer CL1 and the second metal layer CL2 under the photoresist layer pattern PRP are etched using or utilizing the photoresist layer pattern PRP as a mask. The etchant composition according to the embodiment of the present disclosure is used to etch the first metal layer CL1 and the second metal layer CL2.

Figure 1E:
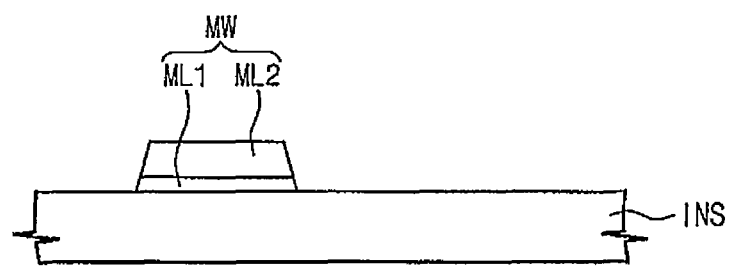

As a result, a metal wiring MW is formed, in which a first metal wiring ML1 formed of the first metal and a second metal wiring M2 formed of the second metal are stacked. Thereafter, as illustrated in FIG. 1E, the final metal wiring MW is exposed by removing the remaining photoresist layer pattern PRP.

A metal wiring formed of the first metal and the second metal, for example, a titanium/copper metal wiring, is fabricated by the above-described processes. Although a method of forming a metal wiring, which is formed of multiple layers, is disclosed in the present description, the present disclosure is not limited thereto. A metal wiring formed of a single layer including copper may be fabricated by substantially the same method.

According to an embodiment of the present disclosure, a display apparatus may be fabricated using an embodiment of the method of fabricating a metal wiring. Therefore, a structure of the display apparatus is first described, and a method of fabricating a display apparatus is then described with reference to the display apparatus.

Figure 2:
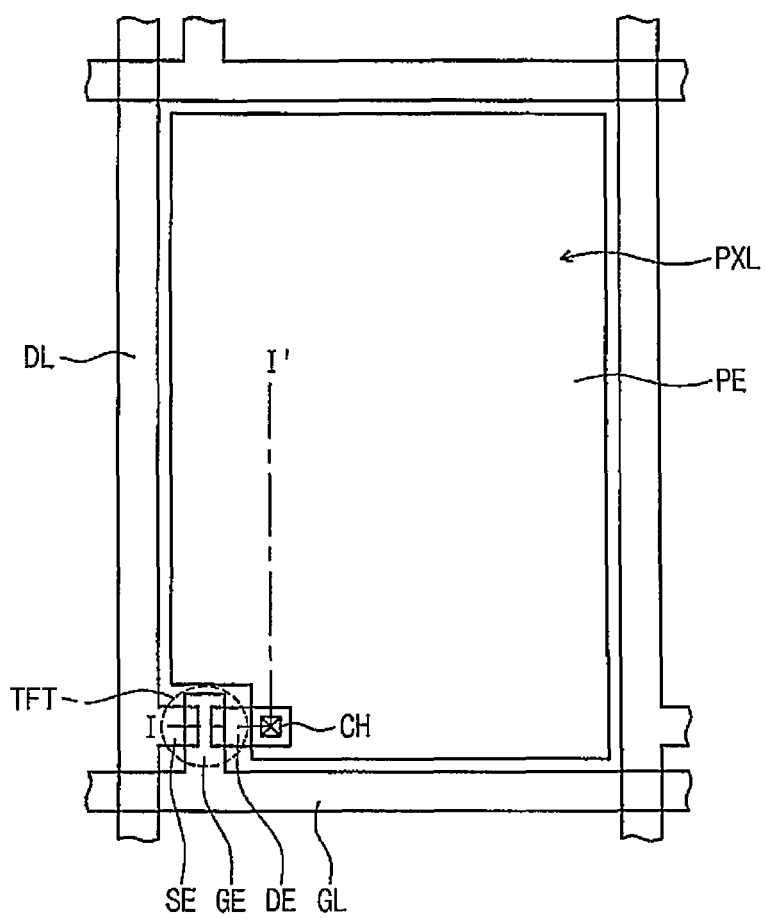
FIG. 2 is a plan view illustrating a structure of a display apparatus which may be fabricated using the etchant composition according to an embodiment of the present disclosure.
Figure 3:
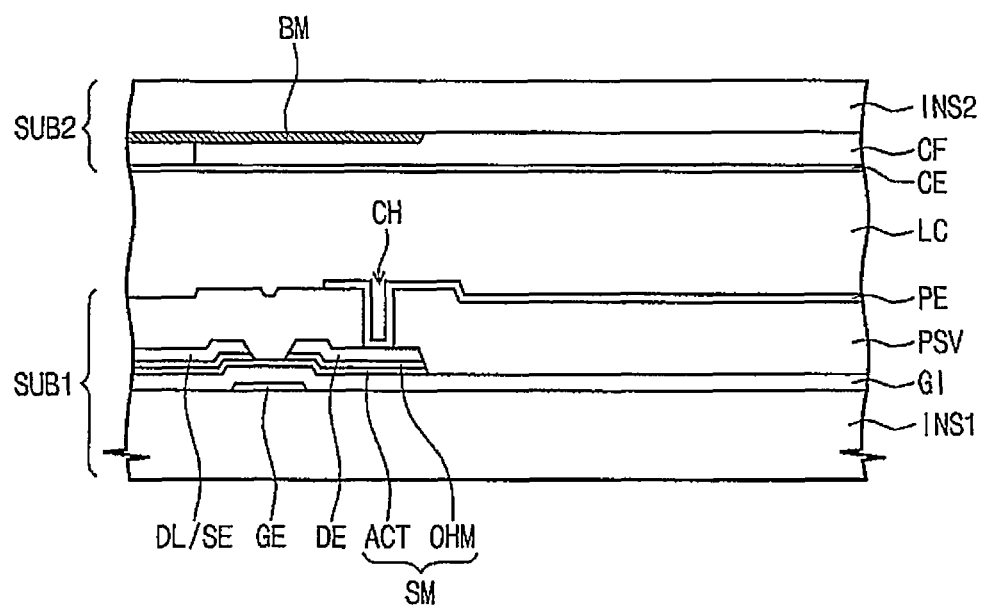
FIG. 3 is a cross-sectional view taken along the line I-I' of FIG. 2.

FIG. 2 is a plan view illustrating a structure of a display apparatus which may be fabricated using or utilizing the etchant composition according to an embodiment of the present disclosure. FIG. 3 is a cross-sectional view taken along line I-I' of FIG. 2.

According to embodiments of the present disclosure, the display apparatus has a plurality of pixels and displays an image. The display apparatus is not particularly limited, and for example, may include various display panels, such as a liquid crystal display panel, an organic light-emitting diode (OLED) display panel, an electrophoretic display panel, an electrowetting display panel, or a microelectromechanical system (MEMS) display panel. A liquid crystal display apparatus among the display apparatuses is illustrated as an example of an embodiment of the present disclosure. Because each pixel is formed in the same structure, a single pixel is illustrated with the gate lines and the data lines that are adjacent to the single pixel among the pixels for convenience of description, and the remaining pixels and associated components are omitted for clarity.

Referring to FIGS. 2 and 3, the display apparatus includes a first substrate SUB1 including a plurality of pixels PXL, a second substrate SUB2 facing the first substrate SUB1, and a liquid crystal layer LC between the first substrate SUB1 and the second substrate SUB2.

The first substrate SUB1 includes a first insulating substrate INS1, and a plurality of gate lines GL and a plurality of data lines DL on the first insulating substrate INS1. The gate lines GL extend in a first direction on the first insulating substrate INS1. The data lines DL are on a gate insulation layer GI and extend in a second direction crossing the first direction.

Each pixel PXL is coupled to (e.g., connected to) a corresponding one of the gate lines GL and a corresponding one of the data lines DL. Each pixel PXL includes a thin film transistor TFT and a pixel electrode PE that is coupled to (e.g., connected to) the thin film transistor TFT.

The thin film transistor TFT includes a gate electrode GE, a semiconductor layer SM, a source electrode SE, and a drain electrode DE.

The gate electrode GE may protrude from the gate line GL.

The semiconductor layer SM is on the gate electrode GE and the gate insulation layer GI is therebetween. The semiconductor layer SM includes an active layer ACT on the gate insulation layer GI, and an ohmic contact layer OHM on the active layer ACT. The active layer ACT is at a region having the source electrode SE and the drain electrode DE planarly formed therein, and a region corresponding to a region between the source electrode SE and the drain electrode DE. The ohmic contact layer OHM is between the active layer ACT and the source electrode SE and between the active layer ACT and the drain electrode DE.

The source electrode SE is formed by branching from the data line DL and at least a portion of the source electrode SE overlaps the gate electrode GE when observed from a plan view. The drain electrode DE is spaced apart from the source electrode SE, and at least a portion of the drain electrode DE overlaps the gate electrode GE when observed from a plan view.

The pixel electrode PE is coupled to (e.g., connected to) the drain electrode DE having a passivation layer PSV therebetween. The passivation layer PSV has a contact hole CH exposing a portion of the drain electrode DE, and the pixel electrode PE is coupled to (e.g., connected to) the drain electrode DE through the contact hole CH.

The second substrate SUB2 faces the first substrate SUB1 and includes a second insulating substrate INS2, a color filter CF included on the, second insulating substrate INS2 to represent color, a black matrix BM included around the color filter CF to block light, and a common electrode CE forming an electric field with the pixel electrode PE.

Figure 4A:
FIGS. 4A through 4C are plan views sequentially illustrating a fabrication process of a thin film transistor substrate in a method of fabricating a display apparatus, according to an embodiment of the present disclosure.
Figure 4A:
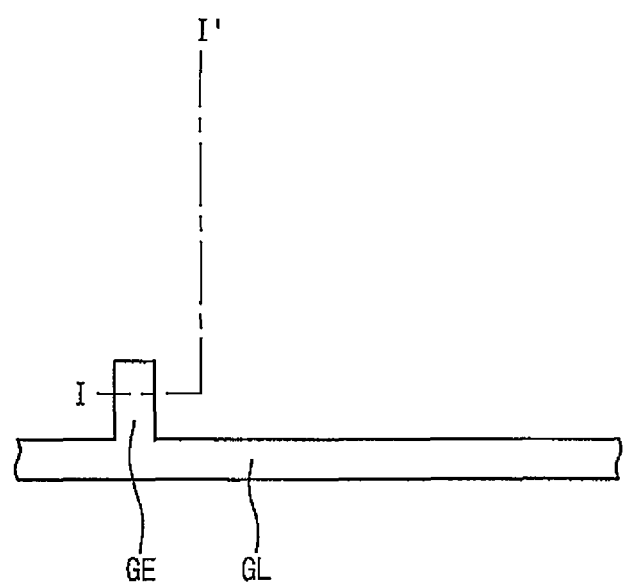
Figure 4B:
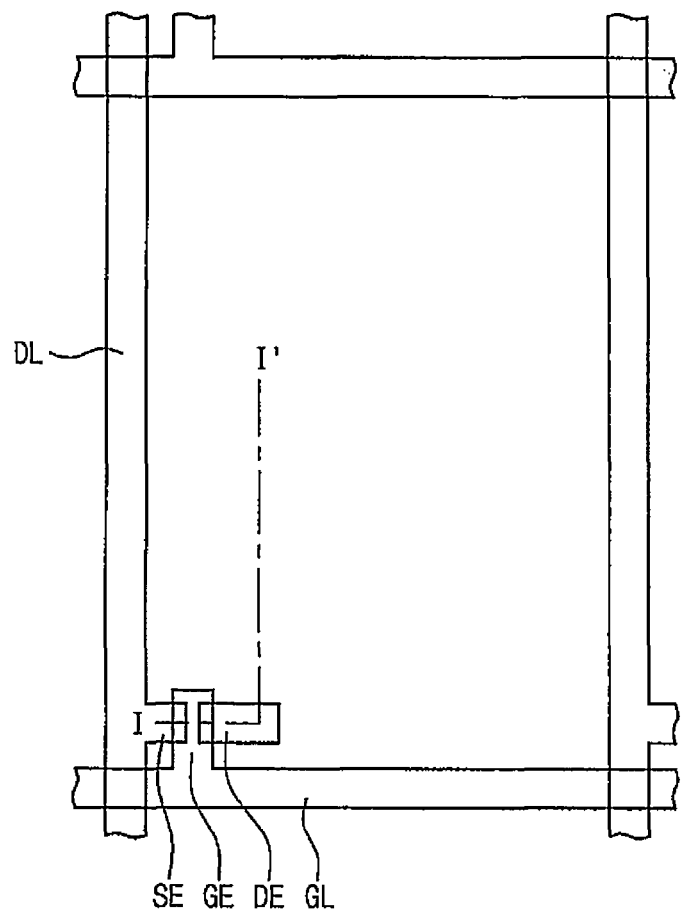
Figure 4C:
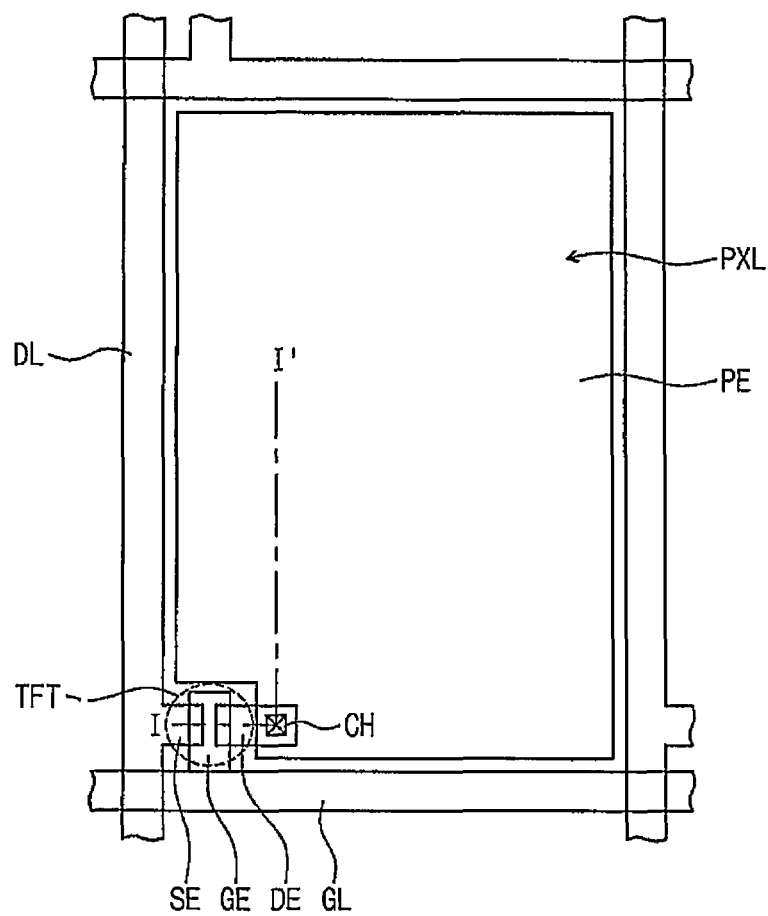

FIGS. 4A through 4C are plan views sequentially illustrating a fabrication process of a thin film transistor substrate in a method of fabricating a display apparatus, according to an embodiment of the present disclosure.

Figure 5A:
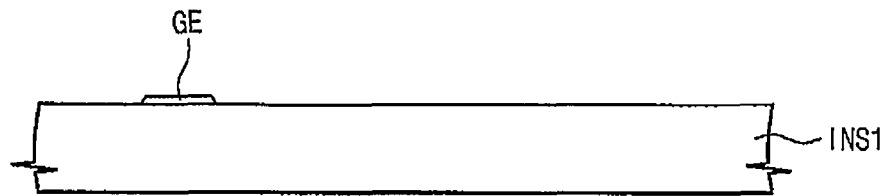
FIGS. 5A through 5C are cross-sectional views taken along the line I-I' of FIGS. 4A through 4C.
Figure 5B:
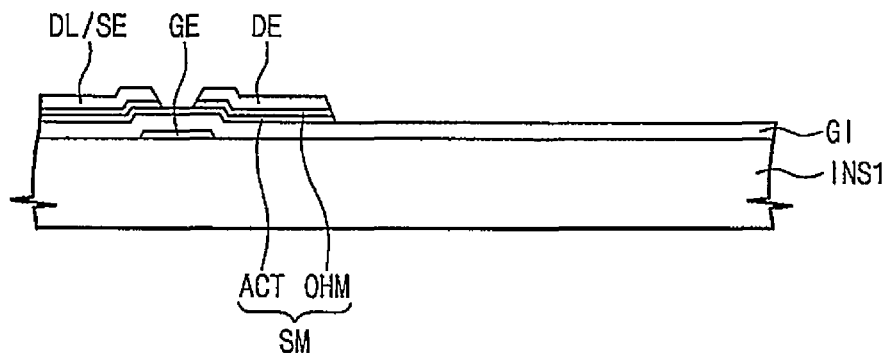
Figure 5C:
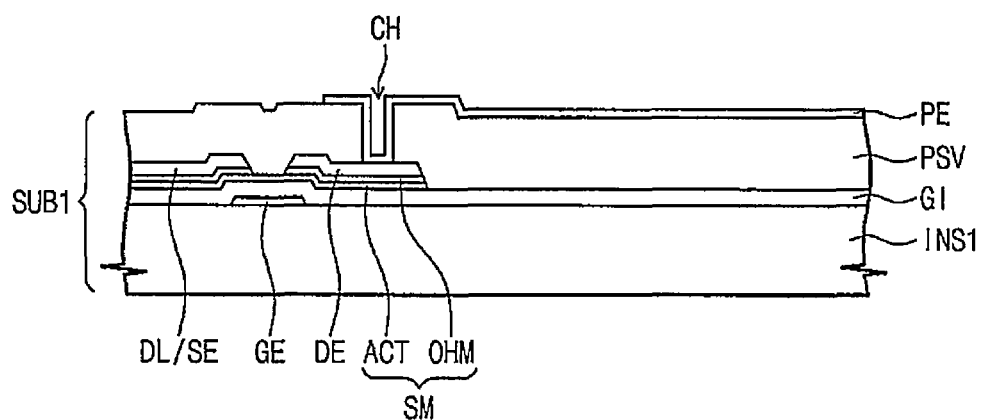
Figure 6A:
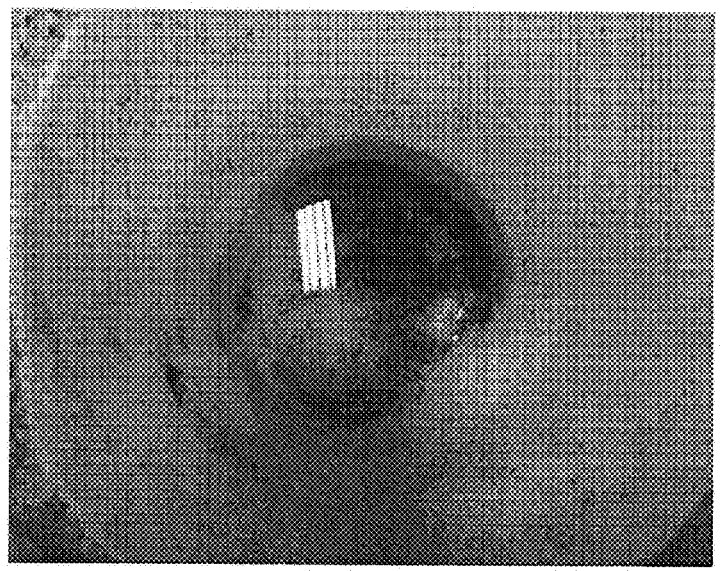
FIGS. 6A through 6D are photographs illustrating insoluble precipitates that are generated as a result of etching copper with an etchant composition of Comparative Example 6.
Figure 6B:
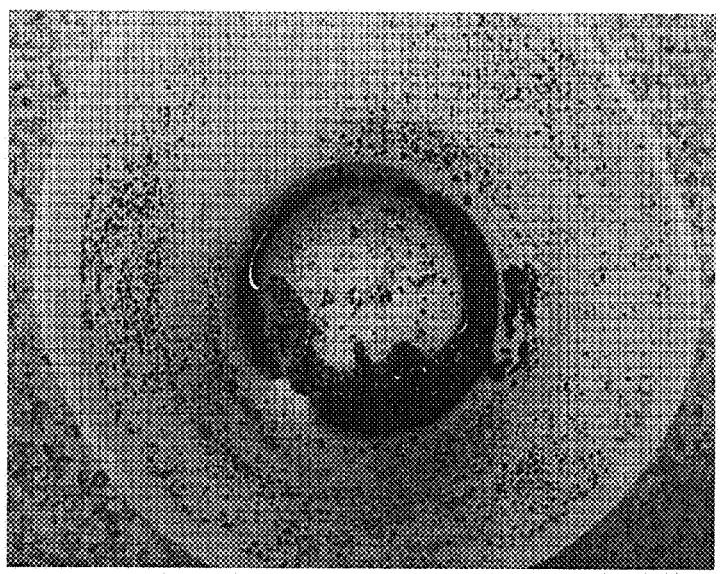
Figure 6C:
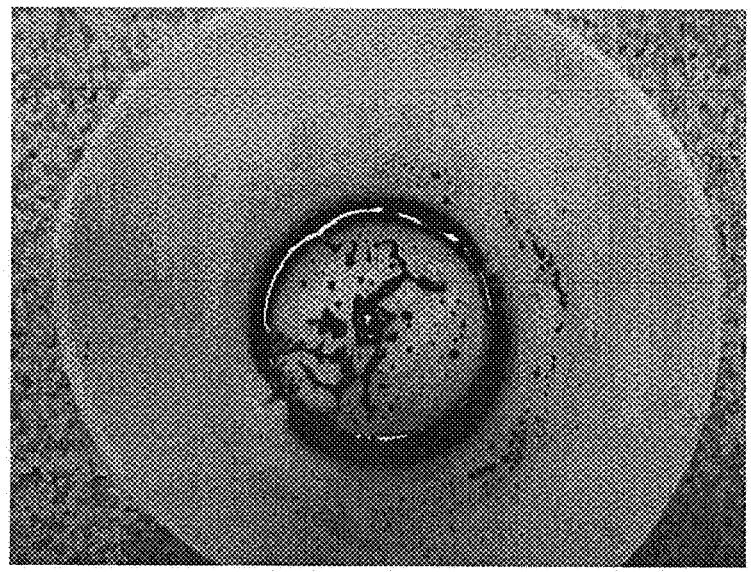
Figure 6D:
Figure 7A:
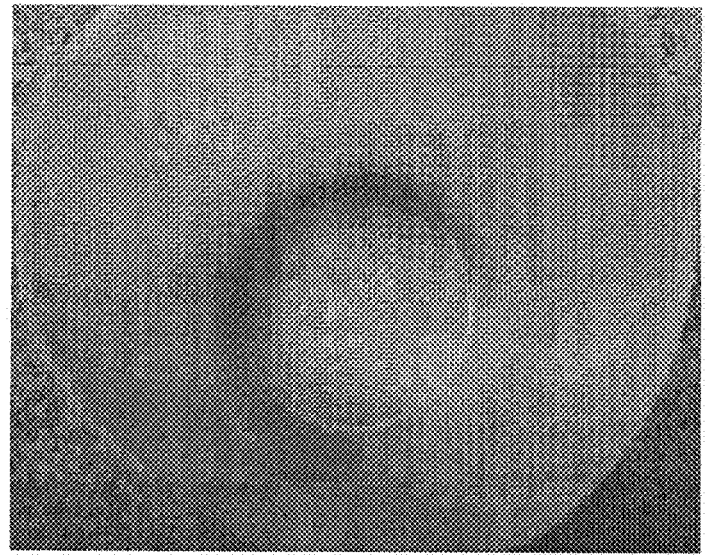
FIGS. 7A through 7D are photographs illustrating insoluble precipitates that are generated as a result of etching copper with an etchant composition of Embodied Example 1.
Figure 7B:
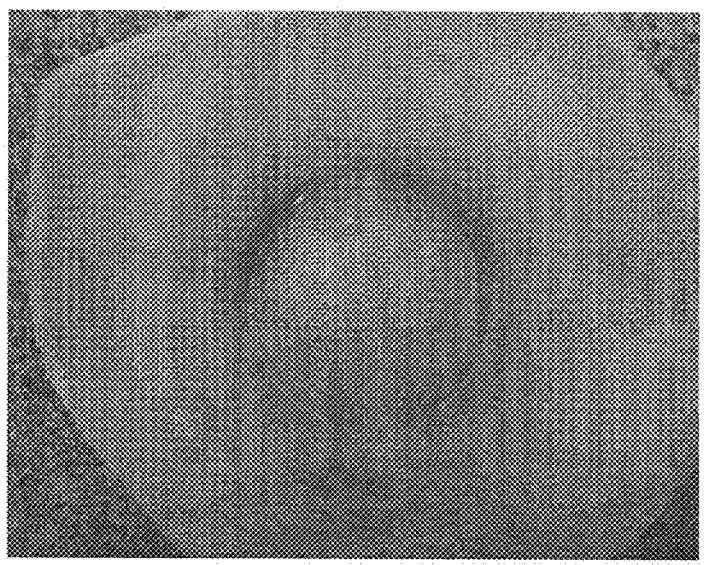
Figure 7C:
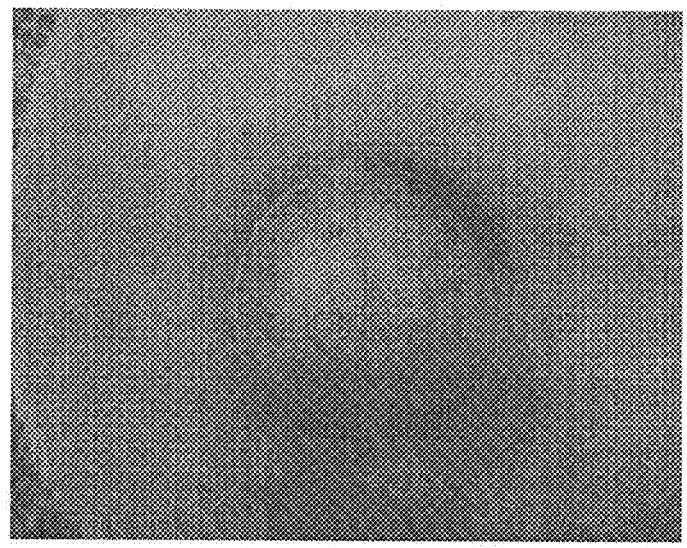
Figure 7D:
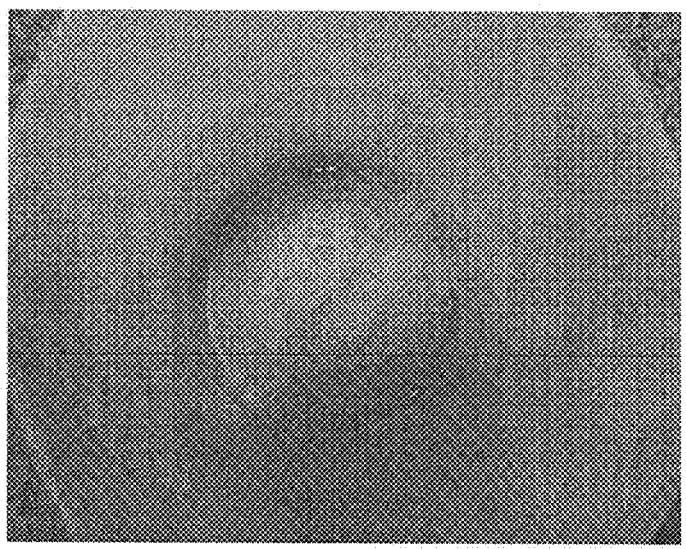

FIGS. 5A through 5C are cross-sectional views taken along line I-I' of FIGS. 4A through 4C.

Hereinafter, a method of fabricating a display apparatus according to an embodiment of the present disclosure will be described with reference to FIGS. 4A through 4C and FIGS. 5A through 5C.

Referring to FIGS. 4A and 5A, a first wiring unit is formed on a first insulating substrate INS1 by a first photolithography process. The first wiring unit includes a gate line GL extending in a first direction, and a gate electrode GE coupled to (e.g., connected to) the gate line GL.

A first conductive layer is formed by sequentially stacking a first metal and a second metal on the first insulating substrate INS1, and the first wiring unit is then formed by etching the first conductive layer using or utilizing a first mask. The first metal may be formed of titanium and the second metal may be formed of copper, but the first and second metals are not limited thereto. The first metal and the second metal may be etched with the etchant composition according to an embodiment of the present disclosure. As a result, the gate line GL and the gate electrode GE may be formed to have a double layer structure in which the first metal and the second metal are sequentially stacked.

Referring to FIGS. 4B and 5B, a gate insulation layer GI is formed on the first insulating substrate INS1 having the first wiring unit formed thereon, and a semiconductor pattern and a second wiring unit are formed on the first insulating substrate INS1 having the gate insulation layer GI formed thereon by a second photolithography process. The second wiring unit includes a data line DL extending in a second direction crossing the first direction, a source electrode SE extending from the data line DL, and a drain electrode DE spaced apart from the source electrode SE.

The gate insulation layer GI is formed by stacking a first insulation material on the first insulating substrate INS1 having the first wiring unit formed thereon.

A first semiconductor material, a second semiconductor material, and the first and second metals are sequentially formed on the first insulating substrate INS1, and the semiconductor pattern and the second wiring unit are then formed by selectively etching the first semiconductor material, the second semiconductor material, and the first and second metals using or utilizing a second mask. The first metal may be formed of titanium and the second metal may be formed of copper, but the first and second metals are not limited thereto. The first metal and the second metal may be etched with the etchant composition according to an embodiment of the present disclosure. As a result, the data line DL, the source electrode SE, and the drain electrode DE may be formed to have a double layer structure in which the first metal and the second metal are sequentially stacked.

The second mask may be a slit mask or a diffraction mask, but the second mask is not limited thereto.

Referring to FIGS. 4C and 5C, a pixel electrode PE is formed on the first insulating substrate INS1 having the second wiring unit formed thereon by third and fourth photolithography processes.

Referring to FIG. 5C, a passivation layer PSV having a contact hole CH, which exposes a portion of the drain electrode DE, is formed on the first insulating substrate INS1 having the second wiring unit formed thereon. A second insulation material layer and a photoresist layer are stacked on the first insulating substrate INS1 having the second wiring unit formed thereon, a photoresist layer pattern is formed by exposing and developing the photoresist layer, and the passivation layer PSV is then formed by removing a portion of the second insulation material layer using or utilizing the photoresist layer pattern as a mask.

Referring to FIG. 5C again, the pixel electrode PE, which is on the passivation layer PSV and coupled to (e.g., connected to) the drain electrode DE through the contact hole CH, is formed by the fourth photolithography process. A transparent conductive material layer and a photoresist layer are sequentially stacked on the first insulating substrate INS1 having the passivation layer PSV formed thereon, a photoresist layer pattern is formed by exposing and developing the photoresist layer, and the pixel electrode PE is then formed by patterning the transparent conductive material layer using or utilizing the photoresist layer pattern as a mask.

The thin film transistor substrate fabricated by the above method (i.e., the first substrate SUB1) faces and is bonded to the second substrate SUB2 having the color filter layer formed thereon. A liquid crystal layer LC is between the first substrate SUB1 and the second substrate SUB2.

Thus, according to the present embodiment, a thin film transistor substrate may be fabricated by a photolithography process. A metal wiring may be formed using or utilizing the etchant composition according to the embodiment of the present disclosure in the photolithography process using or utilizing the first and second masks. However, the forming of the metal wiring using or utilizing the etchant composition is not limited thereto. The etchant composition may be used or utilized (or may only be used or utilized) in a case where the second wiring unit is formed using or utilizing the second mask or the etchant composition may be used (or may only be used) in a case where the first wiring unit is formed using or utilizing the first mask. Also, the etchant composition may be used when a wiring other than the first and second wirings is formed.

Hereinafter, the etchant composition according to embodiments of the present disclosure will be described with reference to examples and comparative examples.

Preparation of Etchant Composition

Etchant compositions according to Embodied Examples 1 to 3 of the present disclosure and etchant compositions according to Comparative Examples 1 to 6 were prepared using or utilizing components in amounts shown in Table 1. In Table 1 the amounts are in weight %, based on a total weight of the etchant composition being 100 weight %.

TABLE 1

| | Persulfate (wt %) | Inorganic acid (wt %) | Fluorine compound (wt %) | Azole-based compound (wt %) | Ascorbic acid (wt %) | Chlorine compound (wt %) | Copper salt (wt %) | Acetic acid (wt %) | Water |
|---|---|---|---|---|---|---|---|---|---|
| Embodied Example 1 | 10 | 3 | 0.5 | 1.2 | 0.5 | 1.5 | 0.19 | 0 | Residual |
| Embodied Example 2 | 10 | 3 | 0.5 | 1.2 | 1 | 1.5 | 0.19 | 0 | Residual |
| Embodied Example 3 | 10 | 3 | 0.5 | 1.2 | 5 | 1.5 | 0.19 | 0 | Residual |
| Comparative Example 1 | 10 | 3 | 0.5 | 1.2 | 0 | 1.5 | 0.19 | 0 | Residual |
| Comparative Example 2 | 10 | 3 | 0.5 | 1.2 | 0 | 0 | 0.19 | 0 | Residual |
| Comparative Example 3 | 10 | 3 | 0.5 | 1.2 | 0 | 1.5 | 0 | 0 | Residual |
| Comparative Example 4 | 10 | 3 | 0.5 | 0 | 0 | 1.5 | 0.19 | 0 | Residual |
| Comparative Example 5 | 10 | 3 | 0.5 | 1.5 | 0.5 | 1.5 | 0.19 | 3 | Residual |
| Comparative Example 6 | 10 | 3 | 0.5 | 1.5 | 0 | 1.5 | 0.19 | 3 | Residual |

In Table 1, sodium persulfate is the persulfate, nitric acid is the inorganic acid, ammonium bifluoride is the fluorine compound, aminotetrazole is the azole-based compound, sodium chloride is the chlorine compound, and copper sulfate is the copper salt.

1st Evaluation of Characteristics of Etchant Composition

In order to evaluate characteristics of the etchant compositions according to the embodied examples and the comparative examples, samples including a titanium layer, a copper layer, and a photoresist pattern sequentially stacked on a glass substrate were prepared. A copper etch rate for each sample was measured by spraying the etchant compositions of Embodied Examples 1 to 3 and Comparative Examples of 1 to 6 to each sample, and CD skew and taper angle for each sample were measured using or utilizing scanning electron micrographs. Also, after etching the samples, the etchant compositions of Embodied Examples 1 to 3 and Comparative Examples 1 to 6 listed in Table 1 were prepared and stored at about 2° C. for a predetermined (or set) period of time, and an amount of precipitates generated (or present) in each etchant composition, based on a total weight of each etchant composition, was then measured.

Table 2 illustrates the evaluation of the etch rate (E/R; units of Å/sec), CD skew, taper angle, and amount of precipitates of the etchant compositions of Embodied Examples 1 to 3 and Comparative Examples of 1 to 6.

TABLE 2

| | Etching characteristics | | | | |
|---|---|---|---|---|---|
| | Cu E/R | CD-skew (one side) | Taper angle | Remarks | Precipitates |
| Embodied Example 1 | 250 | 1.666 | 65 | Very good | Very good |
| Embodied Example 2 | 227 | 1.534 | 65 | Very good | Very good |
| Embodied Example 3 | 139 | 0.758 | 72 | Poor | Very good |
| Comparative Example 1 | 277 | 1.734 | 57 | Good | Very poor |
| Comparative Example 2 | 250 | 1.664 | 61 | Very good | Very good |
| Comparative Example 3 | 200 | 1.901 | 22 | Poor | Very good |
| Comparative Example 4 | 263 | 1.09 | 70 | Poor | Very good |
| Comparative Example 5 | 250 | 1.664 | 60 | Very good | Very poor |
| Comparative Example 6 | 252 | 1.651 | 65 | Very good | Very poor |

Referring to Table 2, when the etching characteristics of etchant compositions of Embodied Examples 1 and 2 and Comparative Examples 2, 5 and 6 were examined, the etching characteristics were very good, in which the copper etch rate was in a range of about 200 Å/sec to about 300 Å/sec, the CD skew (one side) was in a range of about 1.5 μm to about 1.7 μm, and the taper angle was in a range of about 60° to about 70°. When the etching characteristics of the etchant composition according to Comparative Example 1 was examined, the etching characteristics thereof were very good, in which the copper etch rate was in a range of about 200 Å/sec to about 300 Å/sec, the CD skew (one side) was about 1.8 μm, and the taper angle was in a range of about 30° to about 60°. With respect to the etchant compositions according to Embodied Example 3 and Comparative Examples 3 and 4, the etching characteristics thereof were poor.

With respect to the etchant compositions of Embodied Examples 1 to 3, which included an antioxidant or a salt thereof, insoluble precipitates were not generated (or were not observed). However, with respect to the etchant compositions of Comparative Examples 1, 5 and 6, in which the antioxidant or the salt thereof was not included, large amounts of insoluble precipitates were generated.

Although the antioxidant or the salt thereof was not included in the etchant compositions of Comparative Examples 2 to 4, insoluble precipitates were not generated therein, because a copper salt, a chlorine compound, and an azole-based compound, which cause the insoluble precipitates, were not included.

The etchant composition of Comparative Example 5 included the same components as the etchant composition of Embodied Example 1, but also included acetic acid (as a kind of organic acid) and insoluble precipitates were generated in the etchant composition of Comparative Example 5. Without being limited by theory, it is believed that the insoluble precipitates were generated in the etchant composition of Comparative Example 5 as a result of performance degradation of the antioxidant caused by the acetic acid.

2nd Evaluation of Characteristics of Etchant Composition

Table 3 illustrates amounts of insoluble precipitates that were measured when ascorbic acid was added as an antioxidant to the etchant composition of Comparative Example 6 at varying concentrations.

The amounts of the insoluble precipitates shown in Table 3 were measured by the following method. First, a paper filter was installed at one side of an etching chamber and, in order to obtain an etching condition of copper, the copper was etched for about 5 minutes by a method of mixing about 3 kg of the etchant composition of Comparative Example 6 with copper at a concentration of 4,000 ppm. Thereafter, the paper filter was collected and dried for about 24 hours, and then cleaned with water and naturally dried (e.g., air dried) for about 24 hours. Then, a weight of the dried paper filter was measured and a weight of the initial paper filter was deducted therefrom.

TABLE 3

| Condition | Comparative Example 6 | Comparative Example 6 + 0.3 wt % of ascorbic acid | Comparative Example 6 + 0.5 wt % of ascorbic acid | Comparative Example 6 + 0.7 wt % of ascorbic acid | Comparative Example 6 + 1.0 wt % of ascorbic acid |
|---|---|---|---|---|---|
| Amount of precipitation | 0.03 g | 0.0289 g | −0.0037 g | 0.0031 g | 0.0003 g |

According to Table 3, with respect to Comparative Example 6, which did not contain ascorbic acid, the amount of the insoluble precipitates generated in the etchant composition was about 0.03 g. However, the amount of the insoluble precipitates that were generated in the etchant composition was decreased as an amount of the ascorbic acid in the etchant composition was increased from about 0.3 wt % to about 0.5 wt %. In particular, when the amount of the ascorbic acid in the etchant composition was increased to about 0.5 wt %, the insoluble precipitates were not generated.

3rd Evaluation of Characteristics of Etchant Composition

About 3 kg of the etchant compositions of Comparative Example 6 and Embodied Example 1 were prepared, copper was then added to the etchant compositions in various amounts (e.g., concentrations). For example, the copper was separately mixed with about 3 kg of each of the etchant compositions at concentrations of about 0 ppm, about 2,000 ppm, about 4,000 ppm, and about 6,000 ppm. The mixed etchant compositions were stored at about 2° C. for a predetermined (or set) period of time.

FIGS. 6A through 6D and FIGS. 7A through 7D are photographs illustrating insoluble precipitates that were generated in the etchant compositions of Comparative Example 6 and Embodied Example 1. Table 4 shows the amounts of the insoluble precipitates generated according to the amount of copper added to the etchant composition.

TABLE 4

| Amount of etched copper | Comparative Example 6 | Example 1 |
|---|---|---|
| 0 ppm | 1.2451 g | 0.0000 g |
| 2,000 ppm | 15.6915 g | 0.0000 g |
| 4,000 ppm | 9.0322 g | 0.0000 g |

TABLE 4-continued

| Amount of etched copper | Comparative Example 6 | Example 1 |
|---|---|---|
| 6,000 ppm | 2.2486 g | 0.0000 g |

Referring to FIGS. 6A to 6D, FIGS. 7A to 7D, and Table 4, it can be seen that poor soluble (e.g., insoluble) precipitates were generated in Comparative Example 6, but the poor soluble (e.g., insoluble) precipitates were not generated in Embodied Example 1.

4th Evaluation of Characteristics of Etchant Composition

Figure 8A:
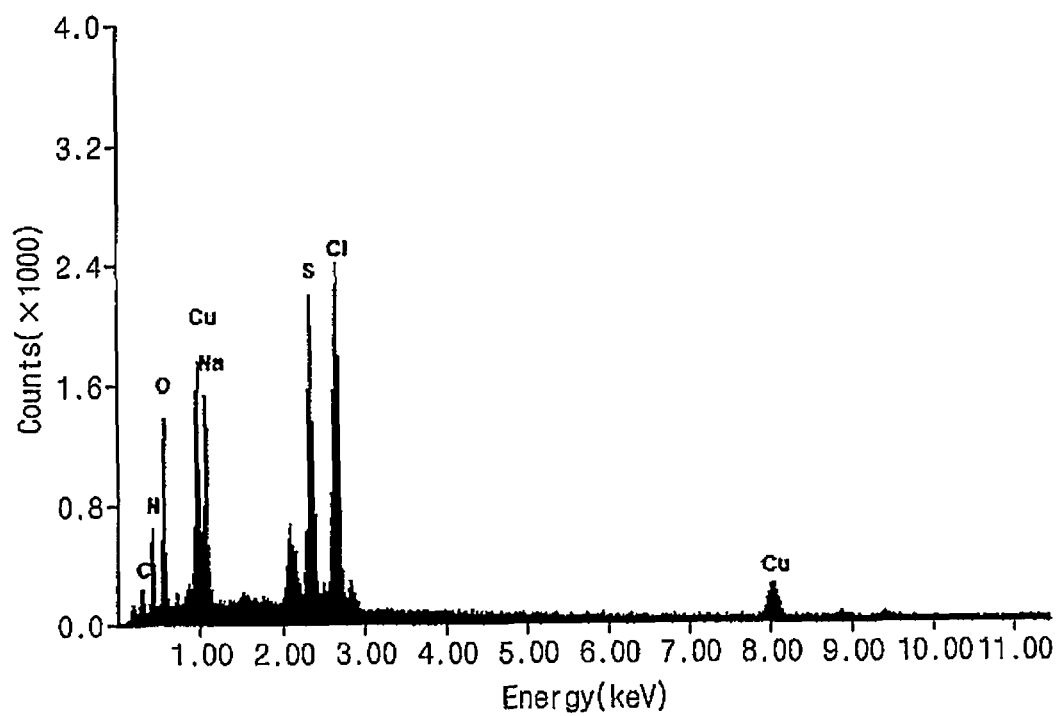
FIGS. 8A and 8B are energy dispersive spectroscopy (EDS) spectrums of Comparative Example 6 and Embodied Example 1, respectively.
Figure 8B:
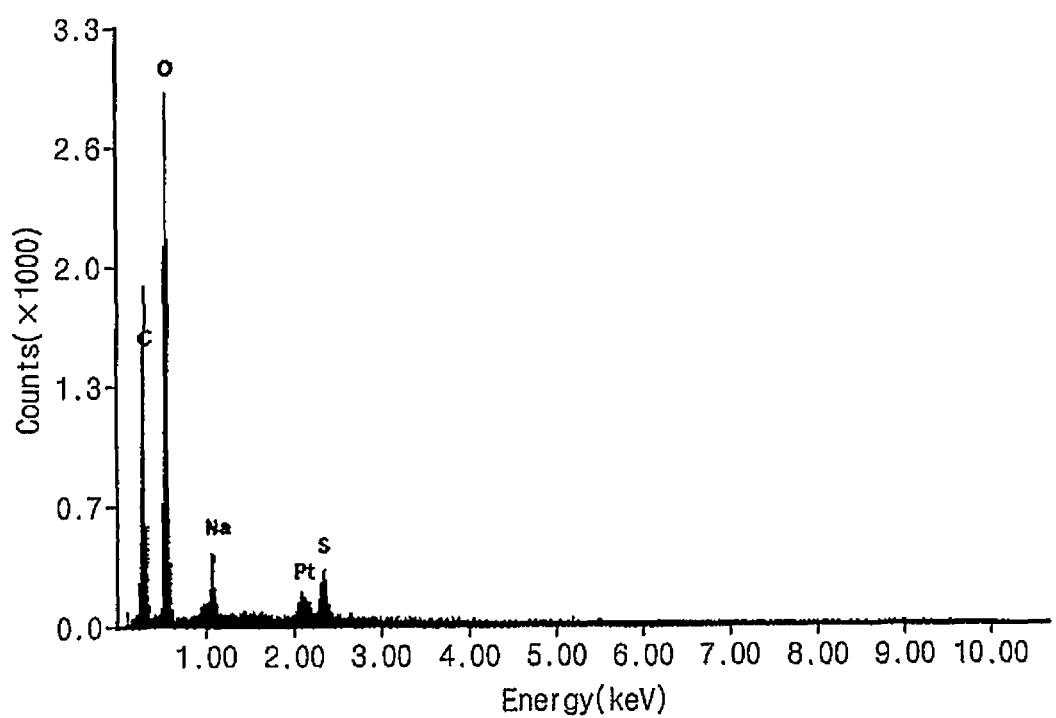

About 3 kg of the etchant compositions of Comparative Example 6 and Embodied Example 1 were prepared and evaluated according to the above-described 2nd Evaluation of characteristics of the etchant composition, and the precipitates on the filter paper were then examined by energy dispersive spectroscopy (EDS). FIGS. 8A and 8B are EDS spectrums of Comparative Example 6 and Embodied Example 1, respectively, and Tables 5 and 6 show the amounts of elements detected in Comparative Example 6 and Embodied Example 1, respectively.

TABLE 5

| Element | Element content (wt %) | Element content (at %) |
|---|---|---|
| C | 5.59 | 10.97 |
| N | 14.92 | 25.11 |
| O | 16.06 | 23.66 |
| Na | 10.25 | 10.51 |
| S | 12.86 | 9.45 |
| Cl | 18.22 | 12.11 |
| Cu | 22.09 | 8.19 |

TABLE 6

| Element | Element content (wt %) | Element content (at %) |
|---|---|---|
| C | 33.91 | 45.76 |
| O | 45.89 | 46.50 |
| Na | 5.25 | 3.70 |
| Pt | 8.33 | 0.69 |
| S | 6.61 | 3.34 |

Referring to FIGS. 8A and 86 and Tables 5 and 6, copper and chlorine which constitute the insoluble precipitates, were detected as precipitates in Comparative Example 6. However, copper and chlorine were not detected as precipitates in Embodied Example 1.

5th Evaluation of Characteristics of Etchant Composition

Table 7 illustrates the results of reference tests in which reference etching was performed using or utilizing the etchant composition of Embodied Example 1 and etching tests were performed by adding about 1,000 ppm of copper powder at a time.

In Table 7 below, the expression "Cu EPD" denotes a time when the etching is completed (end point detection (EPD), second (s)) to a degree to which a line is set, when copper (Cu) is patterned with the etchant composition in a photolithography process.

TABLE 7

| | Ref. | 1,000 ppm | 2,000 ppm | 3,000 ppm | 4,000 ppm |
|---|---|---|---|---|---|
| Cu EPD | ⊚ | ⊚ | ⊚ | ⊚ | ⊚ |
| Cu-Skew (one side) | ⊚ | ⊚ | ⊚ | ⊚ | ⊚ |
| Taper angle | ⊚ | ⊚ | ⊚ | ⊚ | ⊚ |

⊚: very good (within about 10% of variation with respect to the reference)
X: poor (greater than about 10% of variation with respect to the reference)

Referring to Table 7, it can be seen that changes in the etch rate, CD skew, and taper angle were not substantial (or significant) even in the case in which the concentration of copper ions in the etchant composition was increased. As a result, it may be understood that the etchant composition of Embodied Example 1 may reliably be reused.

6th Evaluation of Characteristics of Etchant Composition

About 3 kg of the etchant compositions of Comparative Example 6 and Embodied Example 1 were prepared and stored at about 2° C. for a predetermined (or set) period of time. Then, the amounts of insoluble precipitates were compared and are shown in Table 8 below.

TABLE 8

| | 2 days | 4 days | 6 days | 8 days | 10 days |
|---|---|---|---|---|---|
| Comparative Example 6 | 0.3140 g | 1.2836 g | 1.9855 g | 3.2648 g | 3.4412 g |
| Embodied Example 1 | 0 g | 0 g | 0 g | 0 g | 0 g |

Referring to Table 8, with respect to Embodied Example 1, it can be seen that the insoluble precipitates were not generated even in the case in which the storage period was increased. With respect to Comparative Example 6, it can be seen that the amount of the insoluble precipitates in the etchant composition continuously increased as the storage period was increased.

7th Evaluation of Characteristics of Etchant Composition

Figure 9A:
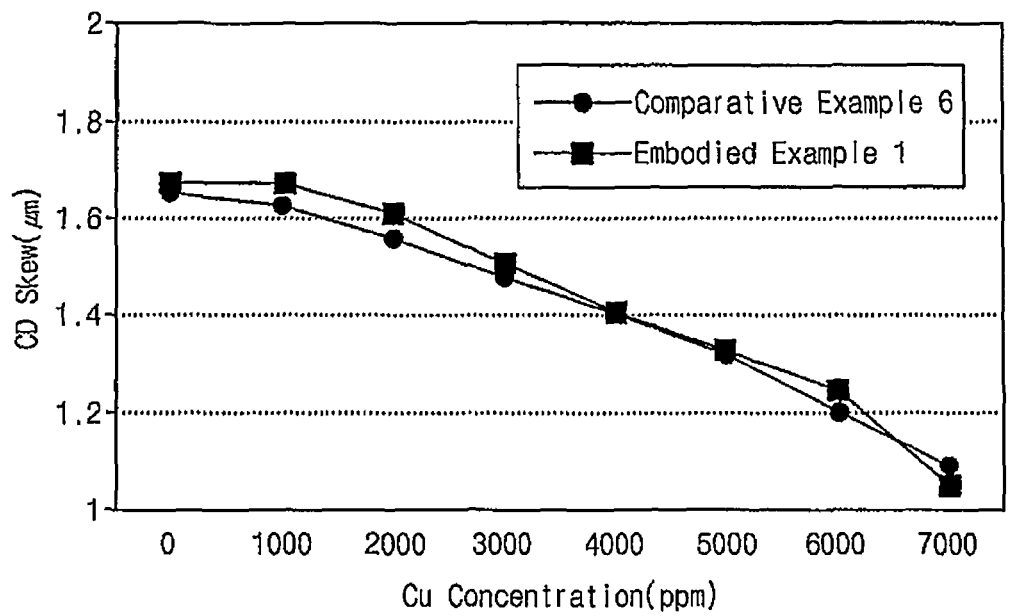
FIGS. 9A and 9B are graphs respectively illustrating a cut dimension (CD) skew and a taper angle according to a copper concentration when reference etching is performed using the etchant compositions of Comparative Example 6 and Embodied Example 1, and etching tests are performed by adding about 1,000 ppm of copper powder at a time.
Figure 9B:
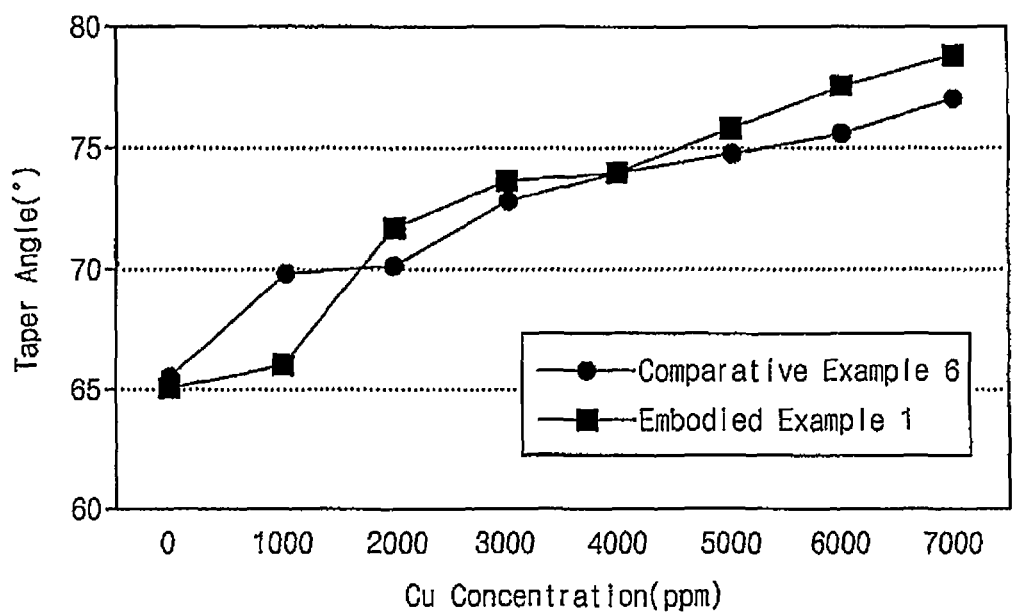

FIGS. 9A and 9B are graphs respectively illustrating a CD skew and a taper angle according to an amount of copper added to an etchant composition when reference etching was performed using or utilizing the etchant compositions of Comparative Example 6 and Embodied Example 1 and etching tests were performed by adding about 1,000 ppm of copper powder at a time.

Referring to FIGS. 9A and 9B, it can be seen that the CD skews and the taper angles of Comparative Example 6 and Embodied Example 1 were at the same level.

8th Evaluation of Characteristics of Etchant Composition

The etchant composition of Embodied Example 1 of the present disclosure was stored at about 10° C. for a predetermined (or set) period of time, and etching tests were then performed with the etchant composition under the same condition for every one day. The results of the etching tests were compared with the results of reference tests, and the results thereof are shown in Table 9 below.

TABLE 9

| Embodied Example 1 | Ref | 1 day | 2 days | 3 days |
|---|---|---|---|---|
| Cu EPD | ⊚ | ⊚ | ⊚ | ⊚ |
| Cu-Skew (one side) | ⊚ | ⊚ | ⊚ | ⊚ |
| Taper angle | ⊚ | ⊚ | ⊚ | ⊚ |

⊚: very good (within about 10% of variation with respect to the reference)
X: poor (greater than about 10% of variation with respect to the reference)

Figure 10A:
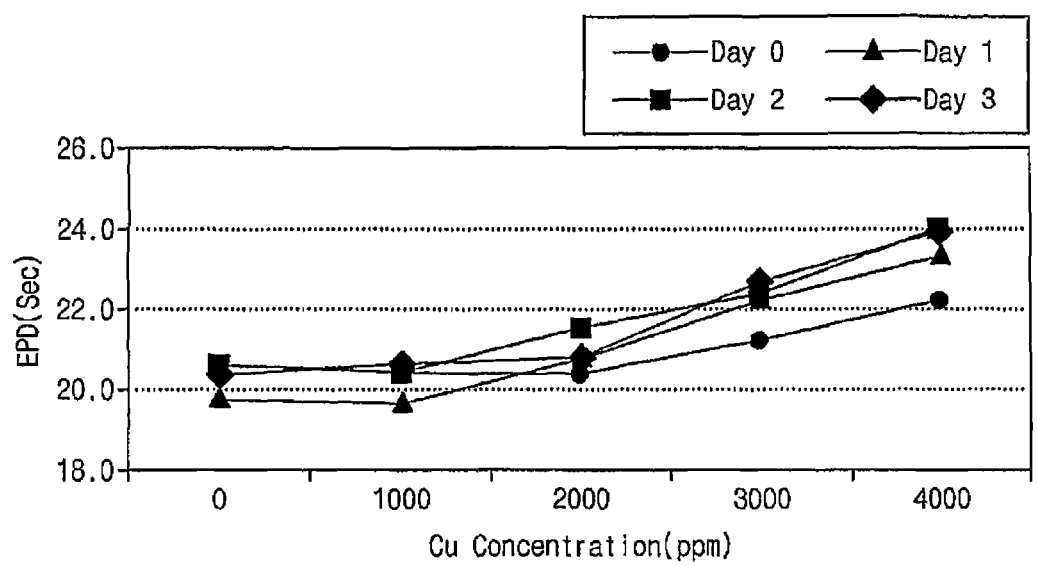
FIGS. 10A through 10C are graphs respectively illustrating copper (Cu) end point detection (EPD), a CD skew, and a taper angle according to storage period of the etchant composition of Embodied Example 1.
Figure 10B:
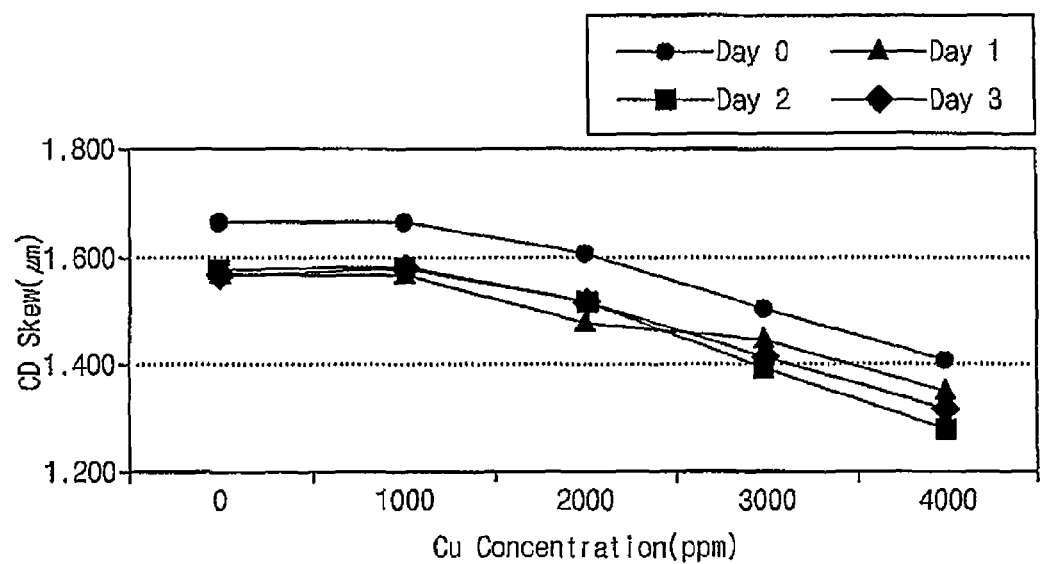
Figure 10C:
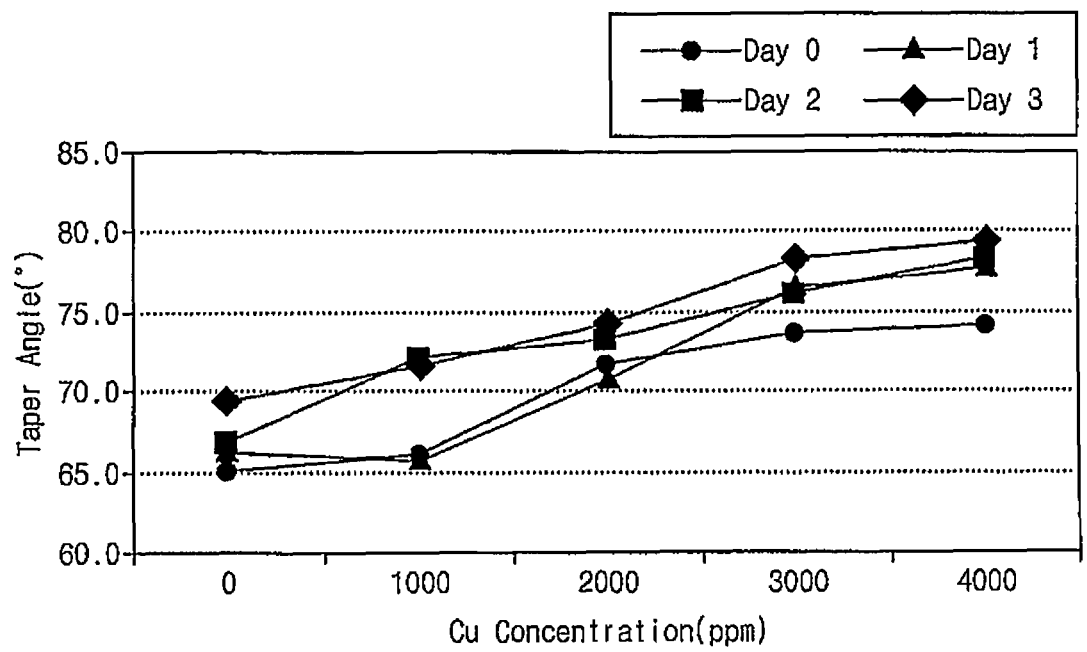

FIGS. 10A through 10C are graphs respectively illustrating Cu EPD, a CD skew, and a taper angle according to a storage period for the etchant composition of Embodied Example 1.

Referring to Table 9, the etch rate, the CD skew, and the taper angle were not substantially (or significantly) changed even in the case in which the storage period of the etchant composition was increased. Therefore, it may be understood that the etchant composition of Embodied Example 1 had excellent storage stability.

9th Evaluation of Characteristics of Etchant Composition

Copper layers having the same (or substantially the same) thickness were formed, and etching was then performed using or utilizing the etchant compositions of Comparative Example 6 and Embodied Example 1 for a period of time that was increased by about 400% based on the copper EPD. Then, the number of open defects of the wiring generated was measured. When about 160 pixels were measured for each etchant composition, 4 defects were detected with respect to the etchant composition of Comparative Example 6, and 3 defects were detected with respect to the etchant composition of Embodied Example 1. Therefore, it can be seen that the degrees of the open defects of the wirings in Comparative Example 6 and Embodied Example 1 were at the same level.

According to an embodiment of the present disclosure, an etchant composition having a high etch rate and improved aging properties as well as less disconnection failure when used to form a wiring may be provided.

According to an embodiment of the present disclosure, a metal wiring having a reduced wiring failure, such as disconnection, may be provided.

Furthermore, according to an embodiment of the present disclosure, a display apparatus having high quality may be provided by fabricating a thin film transistor substrate using or utilizing a method of fabricating the metal wiring.

The above-disclosed subject matter is to be considered illustrative and not restrictive, and the appended claims, and equivalents thereof, are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An etchant composition comprising:
   0.5 wt % to 20 wt % of a persulfate;
   0.01 wt % to 1 wt % of a fluorine compound;
   1 wt % to 10 wt % of an inorganic acid;
   0.01 wt % to 2 wt % of an azole-based compound;
   0.1 wt % to 5 wt % of a chlorine compound;
   0.05 wt % to 3 wt % of a copper salt;
   0.01 wt % to 5 wt % of an antioxidant or a salt thereof comprising ascorbic acid, glutathione, lipoic acid, uric acid, or a salt thereof, based on a total weight of the etchant composition; and
   water in an amount sufficient for the total weight of the etchant composition to be equal to 100 wt %.

2. The etchant composition of claim 1, wherein the persulfate is selected from the group consisting of potassium persulfate ($K_2S_2O_8$), sodium persulfate ($Na_2S_2O_8$), ammonium persulfate (($NH_4$)$_2S_2O_8$), and mixtures thereof.

3. The etchant composition of claim 1, wherein the fluorine compound is selected from the group consisting of hydrofluoric acid (HF), sodium fluoride (NaF), sodium bifluoride ($NaHF_2$), ammonium fluoride ($NH_4F$), ammonium bifluoride ($NH_4HF_2$), ammonium fluoroborate ($NH_4BF_4$), potassium fluoride (KF), potassium bifluoride ($KHF_2$), aluminum fluoride ($AlF_3$), hydrofluoroboric acid ($HBF_4$), lithium fluoride (LiF), potassium fluoroborate ($KBF_4$), calcium fluoride ($CaF_2$), hexafluorosilicic acid ($H_2SiF_6$), and mixtures thereof.

4. The etchant composition of claim 1, wherein the azole-based compound is selected from the group consisting of benzotriazole, aminotetrazole, aminotetrazole potassium salt, imidazole, pyrazole, and mixtures thereof.

5. The etchant composition of claim 1, wherein the chlorine compound is selected from the group consisting of hydrochloric acid (HCl), ammonium chloride ($NH_4Cl$), potassium chloride (KCl), iron chloride ($FeCl_3$), sodium chloride (NaCl), ammonium perchlorate ($NH_4ClO_4$), potassium perchlorate ($K_4ClO_4$), sodium perchlorate ($Na_4ClO_4$), zinc chloride ($ZnCl_2$), and mixtures thereof.

6. The etchant composition of claim 1, wherein the copper salt is selected from the group consisting of copper nitrate ($Cu(NO_3)_2$), copper sulfate ($CuSO_4$), copper ammonium phosphate ($NH_4CuPO_4$), and mixtures thereof.

7. The etchant composition of claim 1, wherein the etchant composition etches a metal layer comprising copper.

8. The etchant composition of claim 7, wherein the metal layer comprises a plurality of layers comprising a first metal layer comprising titanium and a second metal layer comprising copper, the second metal layer being on the first metal layer.

9. A method of forming a metal wiring, the method comprising:
   providing a metal layer comprising copper;
   forming a photoresist layer pattern on the metal layer, and etching a portion of the metal layer with an etchant composition utilizing the photoresist layer pattern as a mask; and
   removing the photoresist layer pattern,
   wherein the etchant composition comprises 0.5 wt % to 20 wt % of a persulfate, 0.01 wt % to 1 wt % of a fluorine compound, 1 wt % to 10 wt % of an inorganic acid, 0.01 wt % to 2 wt % of an azole-based compound, 0.1 wt % to 5 wt % of a chlorine compound, 0.05 wt % to 3 wt % of a copper salt, 0.01 wt % to 5 wt % of an antioxidant or a salt thereof comprising ascorbic acid, glutathione, lipoic acid, uric acid, or a salt thereof, based on a total weight of the etchant composition, and water in an amount sufficient for the total weight of the etchant composition to be equal to 100 wt %.

10. The method of claim 9, wherein the metal layer comprises a first metal layer comprising titanium and a second metal layer comprising copper, the second metal layer being on the first metal layer.

11. The method of claim 9, wherein the persulfate is selected from the group consisting of potassium persulfate ($K_2S_2O_8$), sodium persulfate ($Na_2S_2O_8$), ammonium persulfate (($NH_4$)$_2S_2O_8$) and mixtures thereof.

12. The method of claim 9, wherein the fluorine compound is selected from the group consisting of hydrofluoric acid (HF), sodium fluoride (NaF), sodium bifluoride ($NaHF_2$), ammonium fluoride ($NH_4F$), ammonium bifluoride ($NH_4HF_2$), ammonium fluoroborate ($NH_4BF_4$), potassium fluoride (KF), potassium bifluoride ($KHF_2$), aluminum fluoride ($AlF_3$), hydrofluoroboric acid ($HBF_4$), lithium fluoride (LiF), potassium fluoroborate ($KBF_4$), calcium fluoride ($CaF_2$), hexafluorosilicic acid ($H_2SiF_6$), and mixtures thereof.

13. The method of claim 9, wherein the azole-based compound is selected from the group consisting of benzotriazole, aminotetrazole, aminotetrazole potassium salt, imidazole, pyrazole, and mixtures thereof.

14. The method of claim 9, wherein the chlorine compound is selected from the group consisting of hydrochloric acid (HCl), ammonium chloride ($NH_4Cl$), potassium chloride (KCl), iron chloride ($FeCl_3$), sodium chloride (NaCl), ammonium perchlorate ($NH_4ClO_4$), potassium perchlorate ($K_4ClO_4$), sodium perchlorate ($Na_4ClO_4$), zinc chloride ($ZnCl_2$), and mixtures thereof.

15. The method of claim 9, wherein the copper salt is selected from the group consisting of copper nitrate ($Cu(NO_3)_2$), copper sulfate ($CuSO_4$), copper ammonium phosphate ($NH_4CuPO_4$), and mixtures thereof.

16. A method of forming a thin film transistor substrate, the method comprising:
   forming a gate line and a gate electrode coupled to the gate line on a substrate;
   forming a data line insulatively crossing the gate line, a source electrode coupled to the data line, and a drain electrode spaced apart from the source electrode; and
   forming a pixel electrode coupled to the drain electrode,
   wherein the forming of the data line, the source electrode, and the drain electrode comprises:
   providing a metal layer comprising copper;
   forming a photoresist layer pattern on the metal layer, and etching a portion of the metal layer with an etchant composition utilizing the photoresist layer pattern as a mask; and
   removing the photoresist layer pattern,
   wherein the etchant composition comprises 0.5 wt % to 20 wt % of a persulfate, 0.01 wt % to 1 wt % of a fluorine compound, 1 wt % to 10 wt % of an inorganic acid, 0.01 wt % to 2 wt % of an azole-based compound, 0.1 wt % to 5 wt % of a chlorine compound, 0.05 wt % to 3 wt % of a copper salt, 0.01 wt % to 5 wt % of an antioxidant or a salt thereof, comprising ascorbic acid, glutathione, lipoic acid, uric acid, or a salt thereof based on a total weight of the etchant composition, and water in an amount sufficient for the total weight of the etchant composition to be equal to 100 wt %.

17. The method of claim 16, wherein the metal layer comprises a first metal layer comprising titanium and a second metal layer comprising copper, the second metal layer being on the first metal layer.

\* \* \* \* \*